(12) United States Patent
Yasuda et al.

(10) Patent No.: US 8,569,732 B2
(45) Date of Patent: Oct. 29, 2013

(54) MEMORY ELEMENT AND MEMORY DEVICE

(75) Inventors: Shuichiro Yasuda, Kanagawa (JP); Tomohito Tsushima, Tokyo (JP); Satoshi Sasaki, Kanagawa (JP); Katsuhisa Aratani, Aichi (JP)

(73) Assignee: Sony Corporation, Tokyo (JP)

( * ) Notice: Subject to any disclaimer, the term of this patent is extended or adjusted under 35 U.S.C. 154(b) by 17 days.

(21) Appl. No.: 13/303,544

(22) Filed: Nov. 23, 2011

(65) Prior Publication Data
US 2012/0069631 A1 Mar. 22, 2012

Related U.S. Application Data

(63) Continuation of application No. 12/349,644, filed on Jan. 7, 2009, now Pat. No. 8,350,248.

(30) Foreign Application Priority Data

Jan. 9, 2008 (JP) ................................. 2008-002216

(51) Int. Cl.
*H01L 47/00* (2006.01)

(52) U.S. Cl.
USPC ................. 257/4; 257/3; 257/5; 257/E47.001

(58) Field of Classification Search
USPC ....................... 257/3, 4, 5, E47.001, E21.622
See application file for complete search history.

(56) References Cited

U.S. PATENT DOCUMENTS

| 4,719,594 A | 1/1988 | Young et al. |
| 5,761,115 A | 6/1998 | Kozicki et al. |
| 5,825,046 A | 10/1998 | Czubatyj et al. |
| 5,846,625 A | 12/1998 | Terao et al. |
| 6,087,674 A | 7/2000 | Ovshinsky et al. |
| 6,418,049 B1 | 7/2002 | Kozicki et al. |
| 6,583,003 B1 | 6/2003 | Hsu et al. |
| 6,788,864 B2 | 9/2004 | Ahmad et al. |

(Continued)

FOREIGN PATENT DOCUMENTS

| EP | 1536474 A2 | 6/2005 |
| JP | 2001-502848 A | 2/2001 |

(Continued)

OTHER PUBLICATIONS

"PMC suitable for multilayering of cells" Nekkei Electronics, vol. 2008.1.20, pp. 104.
Phys. Rev. Lett. 21, (1968) p. 1450 by S.R. Ovshinsky is cited as an example of a phase change memory device.
Ramesh et al., Electrical switching in germaniu, telluride glasses doped with Cu and Ag. Appl Phys A. 1999;69:421-5.
Chatterjee et al., A PC-based system for studying current-controlled electrical switching in solids. Rev Sci Instrum. Jul. 1994;65(7):2382-7.

*Primary Examiner* — N Drew Richards
*Assistant Examiner* — Yu-Hsi D Sun
(74) *Attorney, Agent, or Firm* — Wolf, Greenfield & Sacks, P.C.

(57) ABSTRACT

A memory device of a resistance variation type, in which data retaining characteristic at the time of writing is improved, is provided. The memory device includes: a plurality of memory elements in which a memory layer is provided between a first electrode and a second electrode so that data is written or erased in accordance with a variation in electrical characteristics of the memory layer; and pulse applying means applying a voltage pulse or a current pulse selectively to the plurality of memory elements. The memory layer includes an ion source layer including an ionic-conduction material and at least one kind of metallic element, and the ion source layer further contains oxygen.

16 Claims, 7 Drawing Sheets

(56) References Cited

U.S. PATENT DOCUMENTS

| | | |
|---|---|---|
| 6,977,835 B2 | 12/2005 | Kang |
| 7,015,494 B2 | 3/2006 | Campbell |
| 7,071,485 B2 | 7/2006 | Takaura et al. |
| 7,129,133 B1 | 10/2006 | Avanzino et al. |
| 7,307,270 B2 * | 12/2007 | Aratani et al. .................... 257/2 |
| 7,838,861 B2 * | 11/2010 | Klostermann .................... 257/2 |
| 2002/0168820 A1 | 11/2002 | Kozicki et al. |
| 2003/0048519 A1 | 3/2003 | Kozicki |
| 2003/0234449 A1 | 12/2003 | Aratani et al. |
| 2005/0093043 A1 | 5/2005 | Morita et al. |
| 2005/0226036 A1 | 10/2005 | Aratani et al. |
| 2006/0092691 A1 | 5/2006 | Shiimoto et al. |
| 2006/0104106 A1 | 5/2006 | Aratani et al. |
| 2006/0126423 A1 * | 6/2006 | Aratani et al. ............... 365/232 |
| 2006/0189084 A1 | 8/2006 | Mizuguchi et al. |
| 2007/0012959 A1 * | 1/2007 | Hachino et al. ............... 257/260 |
| 2008/0083918 A1 | 4/2008 | Aratani et al. |
| 2008/0089112 A1 | 4/2008 | Aratani et al. |

FOREIGN PATENT DOCUMENTS

| | | |
|---|---|---|
| JP | 2001-525606 A | 12/2001 |
| JP | 2002-536840 | 10/2002 |
| JP | 2004-6579 A | 1/2004 |
| JP | 2004-119958 A | 4/2004 |
| JP | 2004-288843 A | 10/2004 |
| JP | 2005-197634 A | 7/2005 |
| JP | 2007-294592 | 11/2007 |
| JP | 2009-043873 | 2/2009 |
| JP | 2009-043905 | 2/2009 |
| JP | 2009-146480 | 7/2009 |
| WO | WO 00/48196 A1 | 8/2000 |
| WO | WO 03/094227 | 11/2003 |
| WO | WO 2004/084306 A1 | 9/2004 |
| WO | WO 2004/100266 A1 | 11/2004 |
| WO | WO 2008/001712 | 1/2008 |

\* cited by examiner

MEMORY ELEMENT AND MEMORY DEVICE

CROSS REFERENCE TO RELATED APPLICATIONS

The present invention is a continuation application of U.S. application Ser. No. 12/349,644, filed Jan. 7, 2009, which claims the priority benefit of Japanese patent application number 2008-002216, filed in the Japanese Patent Office on Jan. 9, 2008, which is hereby incorporated by reference to the maximum extent allowable by law.

BACKGROUND OF THE INVENTION

1. Field of the Invention

The present invention relates to a memory element and a memory device with which information (data) is written or erased in accordance with a change in the electrical property of a memory layer including an ion source layer.

2. Description of the Related Art

Examples of a well-known memory device used in information technology device such as a computer include not only a DRAM (Dynamic Random Access memory), which is a memory with high-speed and high-density operation but also non-volatile memory such as a flash memory, FeRAM (Ferroelectric Random Access Memory), and MRAM (Magnetoresistive Random Access Memory). Such memories makes it possible to retain stored data for a long time without power supply, but there are some merits and demerits respectively. As for the flash memory, its integration degree is high while its operation speed is not so fast. In the case of FeRAM, there is a limit of mirofabrication necessary for higher integration and there is also a disadvantage in its fabrication process. MRAM has a disadvantage in its power consumption.

Accordingly, a memory element of a new type, which is advantageous in particular to the limit of mirofabrication of a memory device, has been proposed. The memory device is configured in such a manner that an ion conductor containing a specific metal is sandwiched between two electrodes. The memory element is configured so that one of the two electrodes includes the metal contained in the ion conductor, therefore, when voltage is applied across the two electrodes, the metal contained in the electrode is diffused as an ion into the ion conductor so that electrical properties such as the resistance of the ion conductor and capacitance are changed. For example, Japanese Patent Publication No. 2002-536840 and Nikkei Electronics 20 Jan. 2003 (page 104) disclose a memory device in which the above-mentioned characteristics are used. In particular, Japanese Patent Publication No. 2002-536840 proposes an ionic conductor of a solid solution constituted from a chalcogenide and a metal.

SUMMARY OF THE INVENTION

However, the above-mentioned memory element of such a configuration has a disadvantage as follows. That is, when the element is left for a long time or in a temperature atmosphere higher than room temperature in a storing state where the resistance of the ionic conductor is low (for example, "1"), or in an erasing state where the resistance thereof is high (for example, "0"), the resistance is changed and it becomes difficult to retain the data as it is. Thus, a memory element with such a low data-retaining capacity is insufficient to be used for nonvolatile memories.

To increase storage capacity per area, if the high resistance state is set not only to "0" but also to several hundred MΩ and the low resistance state is set not only to "1" but also to several kΩ so that any intermediate resistance value therebetween is retained, for example, it becomes possible not only to enlarge the operation margin of a memory element but also to realize a multiple-value recording. Namely, if four resistance states are memorizable, 2-bit data per element is stored, and if sixteen resistances are memorizable, 3-bit data per element is stored. This enable to increase the memory capacitance twice and three times, respectively.

It is desirable to provide a memory element in which the data retaining characteristics at the time of writing improves, and which enables multiple-value recording because of better controllability of resistance, and to provide a memory device using the memory element.

According to an embodiment of the present invention, there is provided a memory element including a first and a second electrodes and a memory layer provided between the first electrode and the second electrode so that data is written or erased in accordance with a variation in electrical characteristics of the memory layer. The memory layer has an ion source layer including an ionic-conduction material and at least one kind of metallic element, and the ion source layer further contains oxygen.

According to an embodiment of the present invention, there is provided a memory device including: a plurality of memory elements in which a plurality of memory layers are provided between a first electrode and a second electrode and data is written or erased in accordance with a variation in electrical characteristics of the memory layers; and pulse applying means applying a voltage pulse or a current pulse selectively to the plurality of memory elements. Here, the above-mentioned memory elements of the embodiment of the present invention are used as a memory element.

In the memory element or memory device of an embodiment of the present invention, a voltage pulse or a current pulse is applied in the "positive direction" (for example, the first electrode is negative potential and the second electrode is positive potential) to an element in a high resistance state at the time of writing, thereby a conduction path including a metallic element is formed on the first electrode side of the memory layer and the memory layer comes into a low resistance state. Here, since oxygen is contained in the ion source layer that constitutes the memory layer, the low resistance state can be stably retained.

According the memory element or memory device of an embodiment of the present invention, since oxygen is contained in the ion source layer which constitutes the memory layer, the data-retaining state at the time of writing is stabilized and multiple-value recording becomes available because of better controllability of resistance.

Other and further objects, features and advantages of the invention will appear more fully from the following description.

DESCRIPTION OF THE PREFERRED EMBODIMENTS

Embodiments of the present invention will be described in detail hereinbelow with reference to the drawings.

Figure 1:
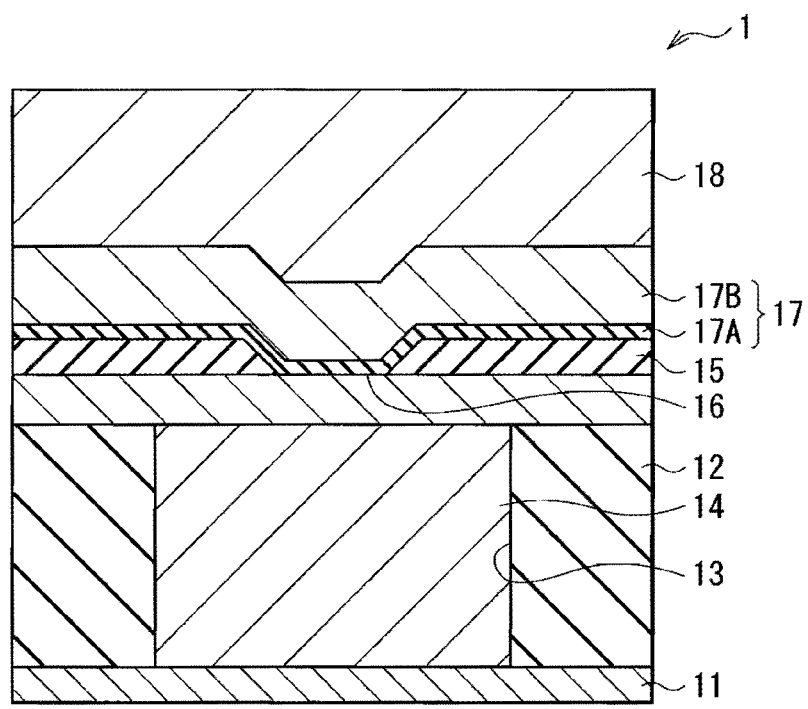
FIG. 1 is a sectional view of a memory element according to an embodiment of the present invention.

FIG. 1 shows a cross-sectional configuration of a memory element 1 according to an embodiment of the present invention. In the memory element 1, an insulating layer 12 is formed on a wiring layer 11, and a groove 13 is formed in the insulating layer 12 so as to reach the wiring layer 11. A lower electrode 14 is formed and embedded in the groove 13. An interlayer insulation film 15 typically having a round opening 16 is formed on the insulating layer 12 and the lower electrode 14 so that the lower electrode 14 may be partially exposed. A memory layer 17 is formed on the lower electrode 14 and the interlayer insulation film 15, and an upper electrode 18 is formed on the memory layer 17. The memory layer 17 has a stacked structure including a high resistance layer 17A and an ion source layer 17B. The high resistance layer 17A is in contact with the lower electrode 14 through the opening 16, and the ion source layer 17B is in contact with the upper electrode 18.

The lower electrode 14 and the upper electrode 18 are formed of W (tungsten), WN (tungsten nitride), Cu (copper), Al (aluminium), Mo (molybdenum), Ta (tantalum), Si (silicon), Zr (zirconium), silicide or the like, for example.

For example, the insulating layer 12 is formed of TEOS (tetra ethyl ortho silicate)-$SiO_2$, and the interlayer insulation film 15 is formed of $SiO_2$ or SiN, respectively. The opening 16 provided in the interlayer insulation film 15 confines the flow of electric current between the lower electrode 14 and the upper electrode 18.

In the present embodiment, the ion source layer 17B forming the memory layer 17 includes not only an ionic-conduction material (anion element) and a metallic element (cationic element) to be ionized but also O (oxygen). It is desirable that the concentration of oxygen is less than 20 atom percent as mentioned later, because the data retaining characteristics at the time of writing are improved.

Examples of an ionic-conduction material may include chalcogenide elements, such as S (sulfur), Se (selenium), and Te (tellurium). Only one of these elements may be used, or two or more of them may be used as a combination.

The metallic element to be ionized forms a metallic conduction path (filament) by being reduced with the cathode electrode at the time of writing operation. The metallic element is preferably more chemically-stabilized element when existing in the metallic state in the ion source layer 17B in which the above-mentioned S, Se, or Te is contained. Preferable examples of such metallic element to be ionized include transition metal elements, such as Zr (zirconium), Ti (titanium), Hf (hafnium), V (vanadium), Nb (niobium), Ta (tantalum), Cr (chromium), Mo (molybdenum), and W (tungsten). One of these elements may be used, or two or more of these metallic elements may be used as a combination. Further, elements other than these transition metal elements, such as Cu (copper), nickel (nickel), Ag (silver), Ge (germanium), and Zn (zinc), may be included, for example. In particular, Zr is more desirable among the above elements from the viewpoint of improvement in the data retaining characteristics at the time of writing and erasing, since it is relatively less likely to dissolve in the chalcogenide, such as Te. To acquire a good memory characteristic, the content is 3 atom percent or more and 40 atom percent or less, for example.

It is further desirable that Al (aluminum) is contained in the ion source layer 17B as an additive element. Because of the inclusion of Al in the ion source layer 17B, an oxide is formed at the time of data erasure when the high resistance layer 17A within the memory layer 17 mainly changes from a low resistance state to a high resistance state. Namely, when an upper electrode is biased to a low potential by erasing operation, Al does not dissolve into the ion source layer 17B but is oxidized in the interface of the anode electrode and the ion source layer 17B exhibiting a characteristic like a solid electrolyte, thereby becoming a chemically-stabilized oxide film (Al oxide film). In this manner, in the present embodiment, the retaining characteristics of the erasing state (high resistance state) is improved, thereby it becomes possible to keep a good retaining characteristics at any resistance region.

Although the ion source layer 17B may include an element which is oxidized in the interface of the ion source layer 17B and the anode electrode like aluminum to generate a stable oxide film, such as Ge (germanium), Mg (magnesium), Si (silicon) and so on, it is desirable to include at least Al.

The content of aluminum in the ion source layer 17B is preferably 20 atom percent or more and 60 atom percent or less. If the content is less than 20 atom percent, the effect of improving the retaining characteristics of high resistance region and effect of improving the repetitive characteristic are reduced. If the content exceeds 60 atom percent, Al ion movement tends to occur easily so that a writing state is generated because of the reduction of Al ion. Further, it is difficult for Al to keep a good stability of metal state in the chalcogenide solid electrolyte, so that the retaining characteristics of lower resistance writing state deteriorates.

Examples of the ion source layer 17B include ZrTeAlOx, TiTeAlOx, CrTeAlOx, WTeAlOx, TaTeAlOx and so on, but Cu, Ge or the like may be further added. Following is a case where the ion source layer 17B is constituted from ZrTeAlOx as an example.

The high resistance layer 17A has a characteristics that resistance is reduced by applying a voltage pulse or a current pulse at the time of writing data. The high resistance layer 17A may be made of any insulator substance or semiconductor substance as far as it is stable when in contact with the above-mentioned ion source layer 17B, but preferably made of an oxide, a nitride or the like containing at least one of a rare earth element such as Gd (gadolinium), Al, Mg, Ta, Si, and Cu. In the case where the high resistance layer 17A is made of an oxide of rare earth element, the resistance thereof may be adjusted with its thickness and/or oxygen content or the like, for example. Although the high resistance layer 17A is not indispensable in the present invention but is preferably provided in order to stabilize the data retaining characteristics. In that case, the high resistance layer 17A is formed so as to be in contact with the lower electrode 14 side as illustrated in FIG. 1.

In the memory element 1 with such a configuration of the present embodiment, when a certain voltage pulse or current pulse is applied from a not-illustrated power supply (pulse applying means) via the lower electrode 14 and the upper electrode 18, the electrical characteristics of the ion source layer 17B, that is, resistance, is changed, thereby writing, erasing and reading of data are carried out. It is to be noted that a memory device of the present invention may be formed by arranging a lot of such memory elements 1 in matrix.

Figure 2:
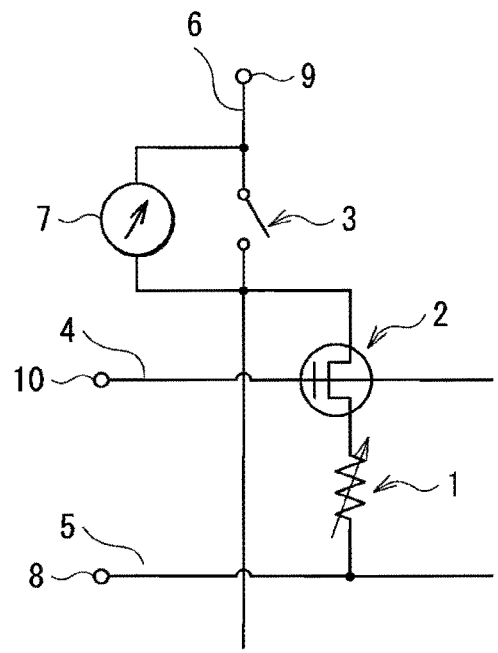
FIG. 2 shows a configuration of a drive circuit of the element of FIG. 1.

FIG. 2 illustrates a configuration of a drive circuit which includes the above-mentioned memory element 1.

In the drive circuit, a selection transistor (NMOS transistor) 2 and a switch 3 are connected to the memory element 1 in series. The upper electrode 18 of the memory element 1 is connected to a terminal 8 via a source line 5, and the lower electrode 14 is connected to an end of the selection transistor 2. The other end of the selection transistor 2 is connected to the terminal 9 via the switch 3 and a bit line 6. The gate section of the selection transistor 2 is connected to a terminal 10 via a word line 4. The above-mentioned terminals are connected to an external pulse voltage source respectively so that a pulse voltage is applied from outside. An amperemeter 7 is provided in parallel with the switch 3 so as to measure the electric current which flows into the circuit when the switch 3 is open.

With such a drive circuit, data is written, erased, and read out by applying pulse voltages as illustrated in FIGS. 3A to 3C to the memory element 1. First, when a positive voltage is applied to the memory element 1 so that the upper electrode 18 may have a positive potential and the lower electrode 14 may have a negative potential, for example, a metal ion of Zr transfers from the ion source layer 17B to combine with an electron on the lower electrode 14 side and deposits. In this manner, a low resistance Zr current path, which is reduced to the metallic state, is formed in the high resistance layer 17A, and the resistance of the memory layer 17 becomes low. Then, by removing the positive voltage so that no voltage is applied anymore to the memory element 1, the low-resistance state is retained. Data is thus written as illustrated in FIG. 3A.

In erasing process, negative voltage is applied to the memory element 1 so that the upper electrode 18 may have a negative potential and the lower electrode 14 may have a positive potential. In this manner, the metal of the Zr current path formed in the high resistance layer 17A is oxidized and ionized, and dissolves into the ion source layer 17B or combines with Te to form a compound. Namely, the current paths disappear or decrease in number and the resistance in the memory layer 17 becomes high. Then, when the negative voltage is removed so that no voltage is applied anymore to the memory element 1, the high-resistance state is retained. Data is thus erased as illustrated in FIG. 3B. So writing and erasing of data in the memory element 1 is repeatedly carried out through a repetition of such process.

Here, for example, when the high-resistance state corresponds to data of "0" and the low-resistance state corresponds to data of "1", respectively, data may be changed from "0" to "1" in the process of data-writing by applying the positive voltage, and may be changed from "1" to "0" in the process of data-erasing by applying the negative voltage.

The written data is read out with the switch 3 opened by detecting the current value flowing through the amperemeter 7, which flows by applying a voltage pulse smaller than the threshold of voltage in which resistance of the memory element 1 changes as illustrated in FIG. 3C.

As described above, in the memory element 1 of the present embodiment, data may be written and erased by applying voltage pulses to the upper electrode 18 and the lower electrode 14. Here, since the ion source layer 17B in the memory layer 17 contains not only an ionic-conduction material and a metallic element to be ionized but also oxygen (O), more preferably, oxygen of less than 20 atom percent, the data retaining characteristics at the time of writing (low resistance state) are improved.

In addition, in the present embodiment, the ion source layer 17B contains Zr as an ionizable element which is relatively difficult to dissolve into chalcogenide such as Te, thereby also improving the data retaining characteristics at the time of writing.

As for the data retaining at the time of erasing (high resistance state), since ionic mobility of Zr is low even under a high temperature or under a prolonged neglect, there is less possibility of the Zr deposition in the metallic state on the cathode electrode. In the case of Zr oxide, since it is stable in the chalcogenide electrolyte, deterioration of oxide does not progress so easily. So it is easy to maintain the high resistance state even when it is neglected over a long time at a temperature higher than a room temperature, thereby improving the data retaining characteristics.

In addition, in the present embodiment, since the ion source layer 17B contains aluminum, the high resistance layer (Al oxide) which contains aluminum is formed on the anode electrode. Since the Al oxide is chemically-stabilized in the chalcogenide solid electrolyte and not react with other elements, it is kept as it is without being destroyed by chemical reaction. As a result, the high resistance state is kept rather easily, and this also improves the data retaining characteristics at the time of erasing.

Thus, as described above, the present embodiment makes it possible to improve the data retaining characteristics in the low resistance state at the time of writing and in the high resistance state at the time of erasing. Therefore, for example, the resistance is retained, if the erasing voltage, which is applied at the time of operation from the lower resistance state to the high resistance state, is adjusted so as to generate an intermediate resistance level between the high resistance state and the low resistance state. In this manner, multivalued memory is available.

Detailed examples of the present invention will be explained hereinbelow.

EXAMPLE

Experiment 1

In order to investigate the effect of introducing oxygen into the above-mentioned ion source layer 17B, a memory element having a sectional structure of FIG. 1 was produced. The lower electrode 14 was made of W, the interlayer insulation film 15 was made of $Si_3N_4$, respectively, and the opening 16 of the interlayer insulation film 15 was formed into a round shape of 60 nm in diameter. A GdOx (gadolinium oxide) film was formed to the thickness of 2 nm as the high resistance layer 17B on the interlayer insulation film 15, using a sputtering system, then a $Zr_{16}Te_{44}Al_{40}Ox$ film was formed to the thickness of 45 nm as the ion source layer 17B using Zr, Te and Al (molar ratio: 16:44:40). At this time, a plurality of films were formed simultaneously by variously changing the argon-oxygen concentration. Subsequently, after forming a Zr film and a W film to the thickness of 20 nm as the upper electrode 18 on the ion source layer 17B, patterning was carried out.

Figure 3:
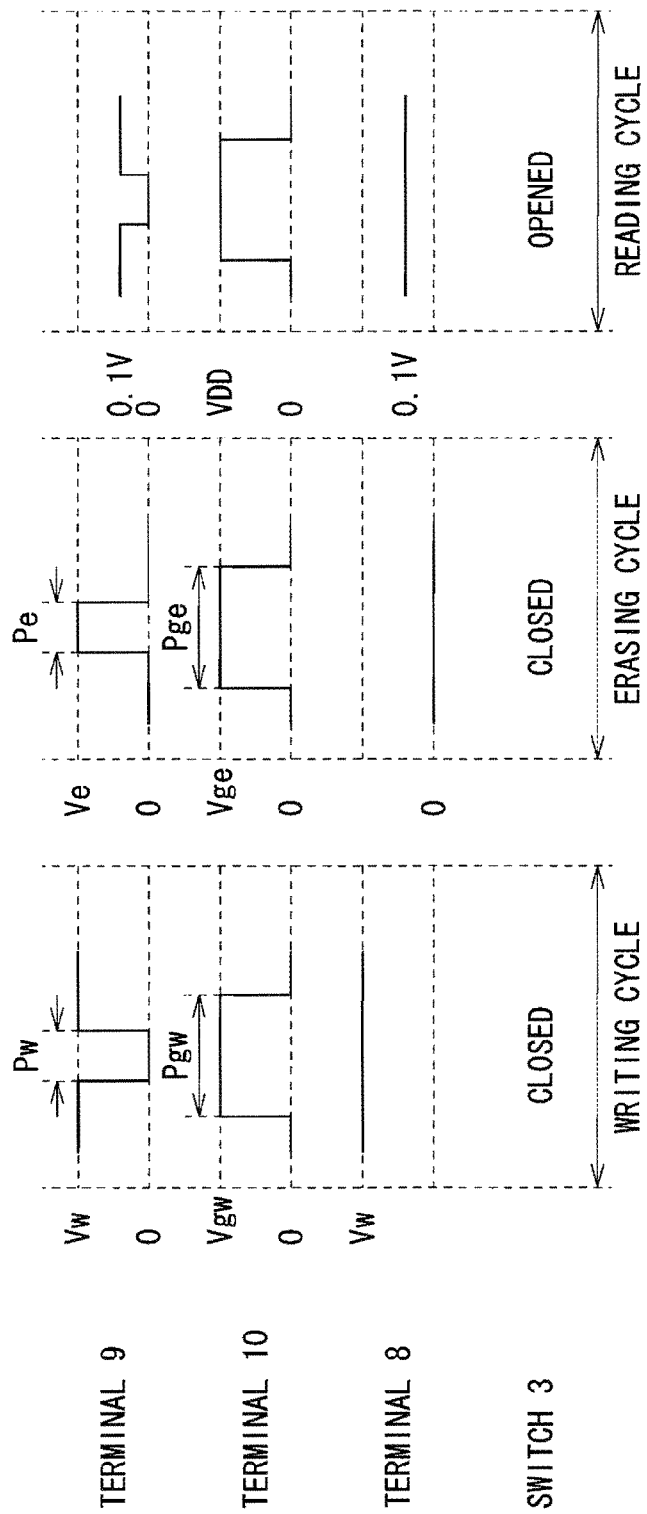
FIGS. 3A to 3C are waveform charts of voltages applied at the time of characterization.
Figure 5:
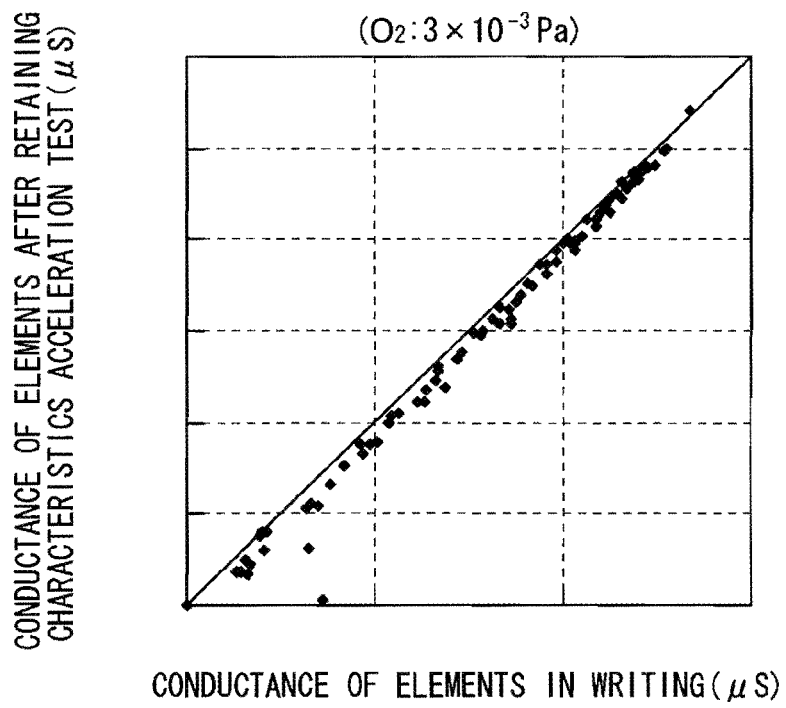
FIG. 5 is a graph showing a data retaining characteristic of an element for Example 1.
Figure 6:
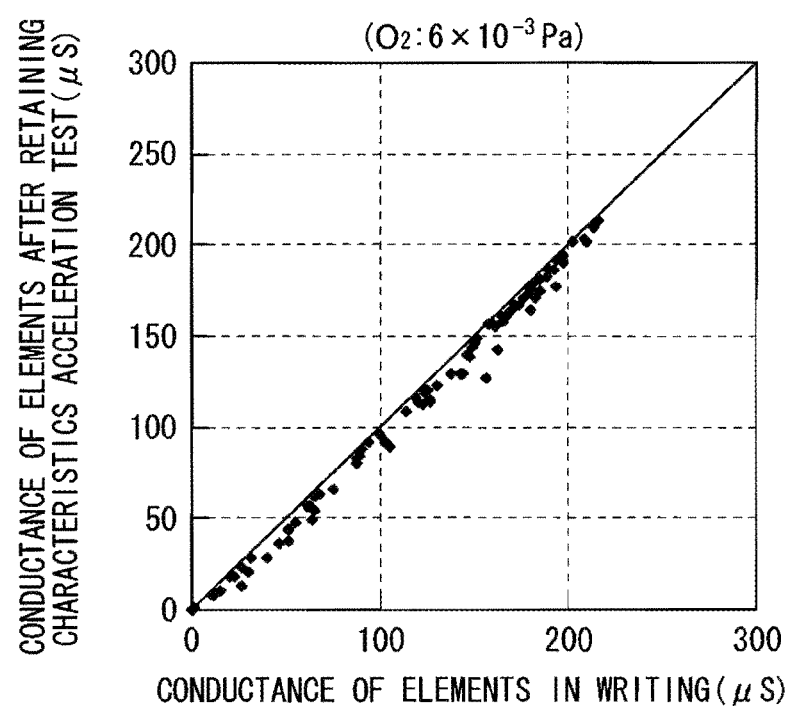
FIG. 6 is a graph showing a data retaining characteristic of an element for Example 2.

Switching characteristic of a plurality of memory elements thus produced was measured using the drive circuit of FIG. 2. An NMOS transistor with its W/L dimension of 0.8 was used as the selection transistor. When the writing-gate voltage is set to 1.3 V and the write voltage is set to 3 V, it is possible to send electric current of 120 μA to the elements. At the time of writing and erasing data, the switch 3 was closed and a write voltage and erasing voltage as illustrated in FIG. 3 were applied to each terminal from the outside. When reading out data from memory elements, the switch 3 was opened and resistance of the elements was measured based on the current value and applied voltage value (in this case, 0.1 V) measured by the amperemeter 7. The results are shown in FIGS. 4 to 6.

Figure 4:
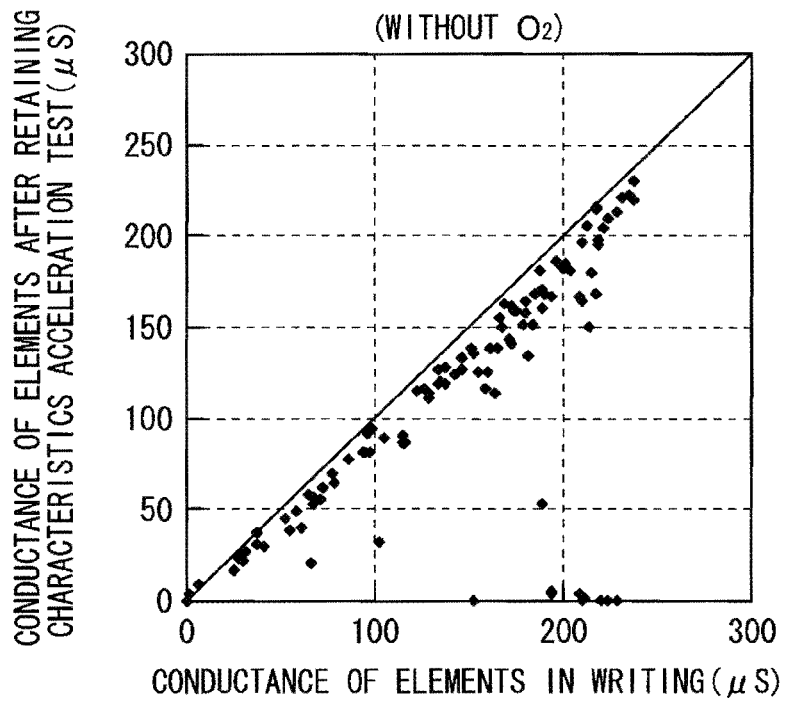
FIG. 4 is a graph showing a data retaining characteristic of an element for Comparative example 1.

FIG. 4 shows the result of Comparative example 1 when oxygen was not contained in the ion source layer 17B (sputtering condition: Ar partial pressure=0.26 Pa). FIG. 5 shows the result of Example 1 when the ion source layer 17B was formed with oxygen plasma (sputtering conditions: Ar partial pressure=0.26 Pa, $O_2$ partial pressure=$3 \times 10^{-3}$ Pa), and FIG. 6 shows the result of Example 2 when the ion source layer 17B was formed with oxygen plasma (sputtering conditions: Ar partial pressure=0.26 Pa, $O_2$ partial-pressure=$6 \times 10^{-3}$ Pa). Although resistance at the time of writing is adjustable by changing the current value and voltage pulse time width necessary for writing, results include slight variations even under the same condition. Then, writing state was formed under various conditions to see how varied the resistance was. In FIGS. 4 to 6, the horizontal axis represents conductance of elements (μS) immediately after the writing, and the vertical axis represents conductance of elements (μS) after performing a retaining characteristics acceleration test under the condition of 130 deg C. for one hour, respectively. If both of the horizontal axis and the vertical axis have the same conductance value, that means that the data retaining characteristics of the element is well secured. Namely, it is said that, the closer the dots to the slant line drawn on the characteristics chart are, the better the retaining characteristics are. As is known by FIGS. 4 to 6, the resistance variation is decreasing as oxygen is introduced more into the ion source layer 17B.

Figure 7A:
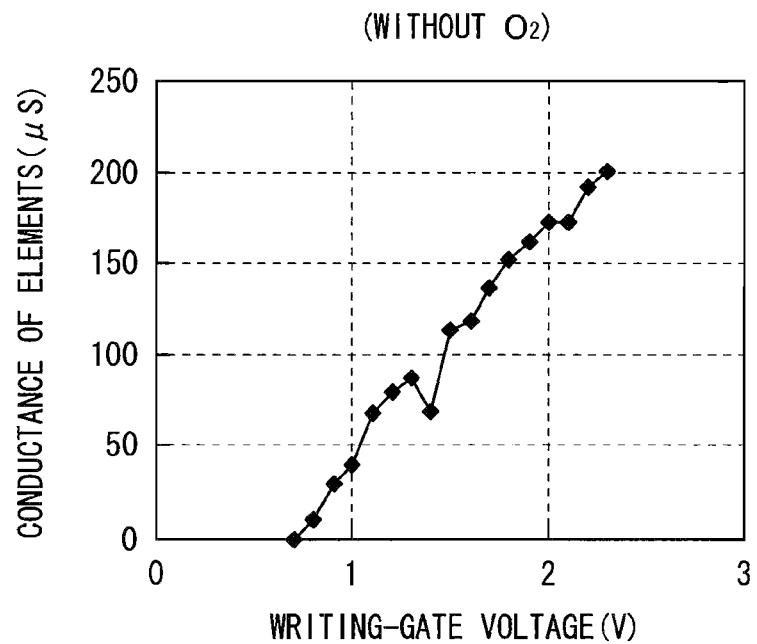
FIGS. 7A and 7B are characteristic charts illustrating the relation between writing-gate voltage and conductance.
Figure 7B:
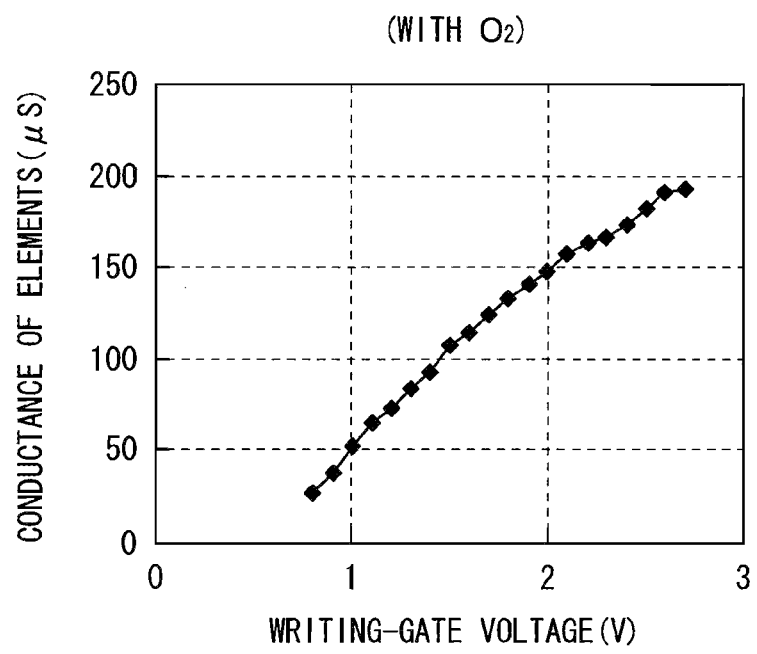

FIGS. 7A and 7B illustrate a shift of conductance when the writing gate voltage is increasingly applied with and without oxygen in the ion source layer 17B. FIG. 7A shows a case where no oxygen was contained in the ion source layer 17B, and FIG. 7B shows a case where the ion source layer 17B was formed by oxygen plasma (sputtering conditions: Ar partial pressure=0.26 Pa, $O_2$ partial-pressure=$6 \times 10^{-3}$ Pa). The write voltage was set to 3 V and write pulse width was set to 100 nsec. It turns out from the figures that when oxygen is not contained in the ion source layer 17B, the conductance value exhibits a large variation and becomes higher. When oxygen is introduced in the ion source layer 17B, the conductance exhibits a linear shifting in accordance with the increase of gate voltage.

Experiment 2

Next, in order to study a possibility of multiple-value recording for the above-mentioned memory element 1, repetitive characteristic for four values was examined on one memory element. Although the layered configuration of the element at that time was the same as the Experiment 1, the round dimension of the opening 16 in the interlayer insulation film 15 of the element was set to 30 nm in diameter. Sputtering conditions were set to the same as the above-mentioned Example 1. The four conductance values were set to 10 μS, 100 μS, 150 μS, and 200 μS, respectively. Recording for higher three conductance levels (100, 150 and 200 μS) was made by writing operation and recording for one lower conductance level (10 μS) was made by erasing operation.

Figure 8:
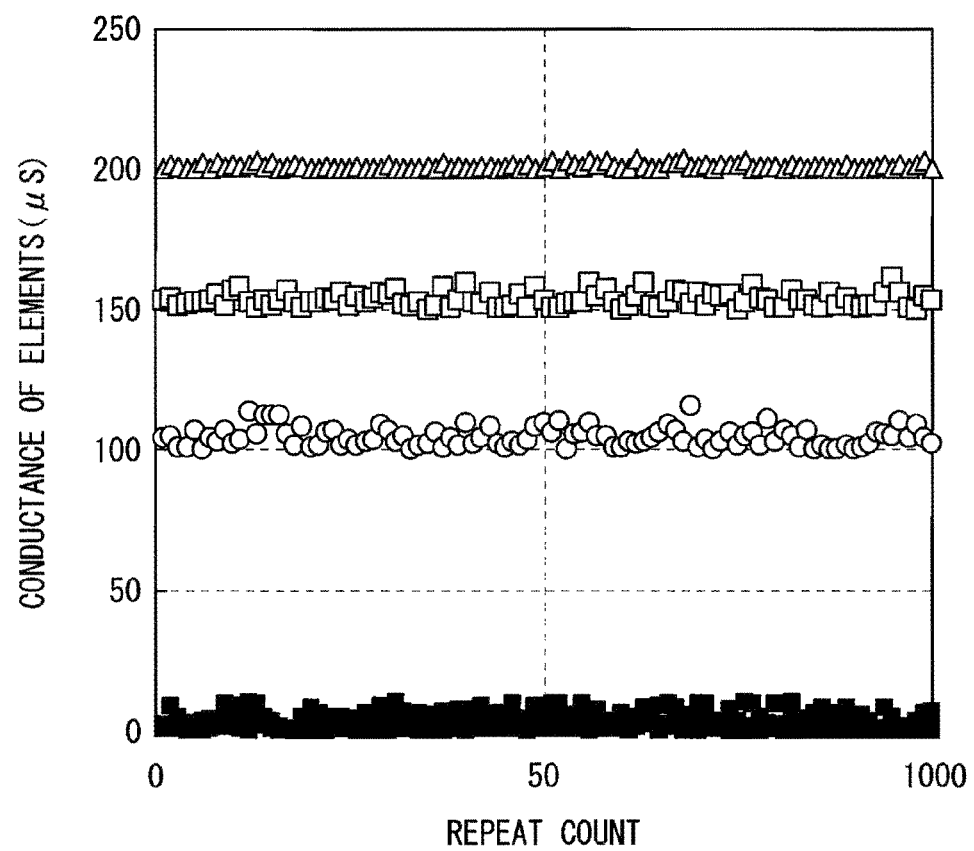
FIG. 8 is a figure for explaining possibility of multiple-value recording.

FIG. 8 illustrates the repetitive characteristics for the four conductance values. Repetition was made by sweeping every pulse 10 sec, both in writing and erasing. The write voltage was set to 2.7 V. The gate voltage was increased each time the voltage pulse was applied in order to set up the resistance value. When erasing, the erasing voltage was set to 1.3 V and the gate voltage was increased by 100 mV each from an initial 2.8 V. Each record was terminated when the conductance value became higher than the preset values for the higher three values for writing operation, and was over when the conductance value became lower than the preset value for the lower one value for erasing operation. The repetition order was 200 μS, 10 μS, 150 μS, 10 μS, 100 μS and 10 μS. As a result, it turned out that operation margin was secured sufficiently in the 100-times repetition.

Experiment 3

In order to investigate an appropriate value of oxygen concentration to be introduced into the ion source layer 17B, the following films were formed by Ar sputtering on an oxide film silicon substrate so that elements of different oxygen concentration were produced. The Ar partial pressure at the time of forming $Zr_{16}Te_{44}Al_{40}Ox$ film was set to 0.25 Pa, and oxygen partial pressure was set to 0 Pa (no $O_2$) for Comparative example 2 and $1 \times 10^{-3}$ Pa (a little $O_2$) for Example 3, and $9.5 \times 10^{-3}$ Pa (a lot of $O_2$) for Example 4 so that three kinds of samples were produced.

W film (film thickness: 30 nm)/GdOx film (film thickness: 1.2 nm)/$Zr_{16}Te_{44}Al_{40}O_x$ film (film thickness: 45 nm)/W film (antioxidant film) (film thickness: 5 nm)

Oxygen concentration in the depth direction was measured about those three kinds of test samples (Comparative example 2 and Examples 3 and 4) using XPS (X-ray photoelectron spectroscopy). The test samples were sputter-etched and their surfaces were analyzed. The measurement condition was as follows.

Measurement Condition
Measuring apparatus: PHI Quantum 2000
Light source: Al—Ka line (1486.6 eV)
Analysis range: about 100 μm in diameter
Analysis depth: several nm
Sputtering source: Ar ion (acceleration voltage: 1 kV)

Figure 9:
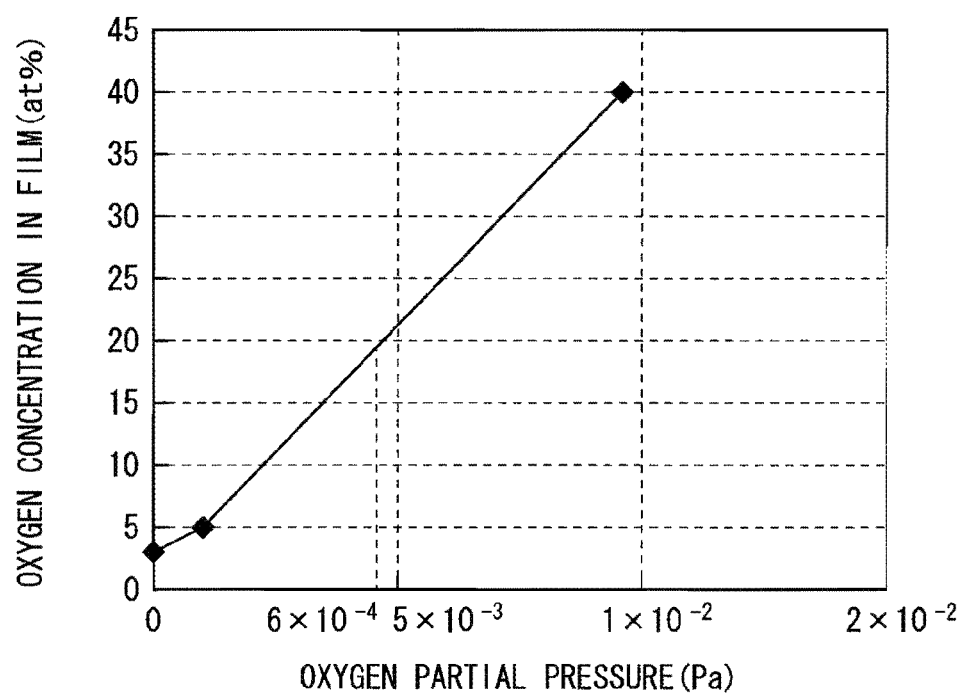
FIG. 9 is a graph for explaining appropriate value of oxygen concentration.

FIG. 9 shows results of the measurement. The oxygen concentration in film was 3 at % in Comparative example 2, 5 at % in Example 3, and 40 at % in Example 4. Since no switching characteristic was exhibited when oxygen partial pressure was $6 \times 10^{-3}$ Pa, the desirable range of oxygen concentration may be less than 20 at %.

As mentioned above, although the present invention has been described with reference to the embodiments and examples, the present invention is not limited to those but may be variously modified. For example, the film structure of the above-mentioned ion source layer 17B is not limited to ZrTeAlOx and may be any other one as far as it contains at least oxygen. The same is also true for the high resistance layer 17A. Namely, the film structure may be other than the above-mentioned structure. What is more, it is also possible to omit the high resistance layer 17A and the memory layer 17 includes only the ion source layer 17B.

Obviously many modifications and variations of the present invention are possible in the light of the above teachings. It is therefore to be understood that within the scope of the appended claims the invention may be practiced otherwise than as specifically described.

What is claimed is:
1. A memory element comprising:
a first electrode and a second electrode; and
a memory layer provided between the first and second electrodes, the memory layer comprising an ion source layer, the ion source layer including:
at least one metallic element,
an ionic-conduction material, aluminum, and
oxygen,
wherein
the memory layer is configured to store data in accordance with variation in electrical characteristics of the memory layer, and
the memory element is configured to form an aluminum oxide at the first electrode at a time of data erasure.

2. The memory element of claim 1, wherein the memory element is further configured to form the aluminum oxide on the first electrode at the time of data erasure.

3. The memory element of claim 1, wherein the memory element is further configured to form the aluminum oxide at an interface of the first electrode and the ion source layer at the time of data erasure.

4. The memory element of claim 1, wherein the memory layer further comprises a high resistance layer between the first electrode and the ion source layer, such that a resistance of the high resistance layer is higher than a resistance of the ion source layer.

5. The memory element of claim 4, wherein the memory element is further configured to form the aluminum oxide between the first electrode and the ion source layer.

6. The memory element of claim 1, wherein the aluminum oxide is a chemically stabilized aluminum oxide film.

7. The memory element of claim 1, wherein a concentration of the aluminum in the ion source layer is greater than or equal to 20 atom percent and less than or equal to 60 atom percent.

8. The memory element of claim 1, wherein:
a conduction path containing the at least one metallic element is formed in the high resistance layer so as to store a low resistance state when a voltage pulse or a current pulse is applied across the first electrode and the second electrode, and
the at least one metallic element comprises at least one of zirconium, hafnium and titanium.

9. The memory element of claim 1, wherein:
a conduction path containing the at least one metallic element is formed in the high resistance layer so as to store a low resistance state when a voltage pulse or a current pulse is applied across the first electrode and the second electrode, and
the at least one metallic element comprises at least copper (Cu).

10. The memory element of claim 1, wherein:
the ionic-conduction material comprises at least one element selected from a group consisting of sulfur, selenium and tellurium, and
the ion source layer further includes at least one of germanium, magnesium, and silicon.

11. The memory element of claim 1, wherein:
the ionic-conduction material comprises at least one element selected from a group consisting of sulfur, selenium and tellurium, and
the ion source layer further includes copper (Cu).

12. A memory device comprising:
a plurality of memory elements comprising a first memory element, the first memory element comprising a memory layer provided between a first electrode and a second electrode, the memory layer comprising an ion source layer, the ion source layer including:
at least one metallic element,
an ionic-conduction material,
aluminum, and
oxygen; and
a power supply configured to apply a voltage pulse or a current pulse selectively to the first memory element,
wherein
the memory layer is configured to store data in accordance with a variation in electrical characteristics of the memory layer, and
the first memory element is configured to form an aluminum oxide at the first electrode at a time of data erasure.

13. The memory device of claim 12, wherein the oxygen concentration in the ion source layer is less than 20 atom percent.

14. The memory device of claim 12, wherein the first memory element further comprises a high resistance layer, a resistance of the high resistance layer being higher than a resistance of the ion source layer, wherein:
the high resistance layer is made of an insulating material and is configured such that the resistance of the high resistance layer is variable,
in a case of voltage being applied to the first memory element, the first memory element is configured to form a current path including the at least one metallic element in the high resistance layer such that the resistance of the high resistance layer decreases, and
in a case of a reverse voltage being applied to the first memory element, the first memory element is configured to diminish the current path such that the resistance of the high resistance layer increases.

15. The memory device of claim 12, wherein:
the first memory element is configured to store at least two bits of data, and
the resistance of the high resistance layer varies in accordance with application of a voltage to the first memory element.

16. The memory device of claim 12, wherein the memory layer is configured to store data in accordance with the variation in electrical characteristics of the memory layer, such that different electrical characteristics correspond to different data values.

* * * * *